(12) United States Patent
Lin et al.

(10) Patent No.: US 8,492,778 B2
(45) Date of Patent: Jul. 23, 2013

(54) LIGHT EMITTING DIODE DEVICE

(75) Inventors: Hou-Te Lin, Hsinchu (TW); Chao-Hsiung Chang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/424,367

(22) Filed: Mar. 19, 2012

(65) Prior Publication Data

US 2013/0026510 A1 Jan. 31, 2013

(30) Foreign Application Priority Data

Jul. 26, 2011 (CN) .......................... 2011 1 0210604

(51) Int. Cl.
*H01L 27/15* (2006.01)

(52) U.S. Cl.
USPC .......................................................... 257/89

(58) Field of Classification Search
USPC ............................................................ 257/89
See application file for complete search history.

(56) References Cited

U.S. PATENT DOCUMENTS

| | | | | |
|---|---|---|---|---|
| 5,821,685 | A * | 10/1998 | Peterson ...................... | 313/467 |
| 6,147,697 | A * | 11/2000 | Deguchi et al. ............. | 347/238 |
| 6,190,821 | B1 * | 2/2001 | Vandenabeele ............. | 430/139 |
| 6,771,236 | B1 * | 8/2004 | Konishi et al. ............. | 345/80 |
| 6,986,581 | B2 * | 1/2006 | Sun et al. ..................... | 353/31 |
| 7,560,749 | B2 * | 7/2009 | Sakata et al. ............... | 257/102 |
| 8,337,029 | B2 * | 12/2012 | Li .................................. | 362/84 |
| 2001/0024084 | A1 * | 9/2001 | Kajiwara ..................... | 313/486 |
| 2005/0023963 | A1 * | 2/2005 | Menkara et al. ............ | 313/503 |
| 2005/0098738 | A1 * | 5/2005 | Laney et al. ................ | 250/483.1 |
| 2005/0100836 | A1 * | 5/2005 | Laney et al. ................ | 430/496 |
| 2005/0121620 | A1 * | 6/2005 | Laney et al. ................ | 250/483.1 |
| 2005/0244760 | A1 * | 11/2005 | Roberts et al. ............. | 430/348 |
| 2009/0004772 | A1 * | 1/2009 | Jinbo et al. .................. | 438/99 |
| 2009/0065799 | A1 * | 3/2009 | Kim et al. ................... | 257/99 |
| 2009/0246486 | A1 * | 10/2009 | Sasaki ......................... | 428/203 |
| 2009/0278151 | A1 * | 11/2009 | Kim .............................. | 257/98 |
| 2010/0164365 | A1 * | 7/2010 | Yoshino et al. ............ | 313/503 |
| 2010/0176720 | A1 * | 7/2010 | Yamazaki .................... | 313/509 |
| 2010/0244067 | A1 * | 9/2010 | Winkler et al. ............. | 257/98 |
| 2011/0181175 | A1 * | 7/2011 | Shimomura et al. ........ | 313/484 |
| 2011/0204769 | A1 * | 8/2011 | Fukuda et al. .............. | 313/503 |
| 2011/0210367 | A1 * | 9/2011 | Kim .............................. | 257/98 |
| 2011/0220950 | A1 * | 9/2011 | Kim et al. ................... | 257/98 |
| 2011/0220955 | A1 * | 9/2011 | Park ............................. | 257/99 |
| 2011/0260192 | A1 * | 10/2011 | Kwak et al. ................ | 257/98 |
| 2012/0080701 | A1 * | 4/2012 | Kim et al. ................... | 257/98 |
| 2012/0168801 | A1 * | 7/2012 | Xuan et al. ................. | 257/98 |
| 2012/0199857 | A1 * | 8/2012 | Humpston et al. ......... | 257/89 |
| 2012/0229019 | A1 * | 9/2012 | Liu et al. .................... | 313/504 |

(Continued)

*Primary Examiner* — Thao Le
(74) *Attorney, Agent, or Firm* — Altis Law Group, Inc.

(57) ABSTRACT

A light emitting diode (LED) device includes a substrate, first and second LED chips arranged on the substrate, and a phosphor layer over the first and second LED chips. The phosphor layer includes a plurality of phosphor units, each including a phosphor particle and a silver halide layer encapsulating the phosphor particle. Light emitted from the second LED chip strikes the phosphor particles to generate a first light, which combines with the light to generate a resultant light. The silver halide layer is reduced by the light from the first LED chip to produce silver particles around the phosphor particles. The silver particles can block the light emitted from the second LED chip from sticking the phosphor particles. By adjusting the current supplied to the first LED chip, the color temperature of the resultant light generated by the LED device can be changed.

17 Claims, 2 Drawing Sheets

U.S. PATENT DOCUMENTS

2012/0241781 A1* 9/2012 Yuan et al. .................. 257/89
2012/0300155 A1* 11/2012 Winkler et al. .............. 349/70
2012/0305922 A1* 12/2012 Yamazaki .................... 257/59
2013/0002134 A1* 1/2013 Matsunaga et al. .......... 313/512
2013/0062591 A1* 3/2013 Jun et al. ..................... 257/9

* cited by examiner

LIGHT EMITTING DIODE DEVICE

BACKGROUND

1. Technical Field

The disclosure relates to illumination devices, and particularly to a light emitting diode (LED) device.

2. Discussion of Related Art

Light emitting diodes' (LEDs) many advantages, such as high luminosity, low operational voltage, low power consumption, compatibility with integrated circuits, easy driving, long term reliability, and environmental friendliness have promoted their wide use as a lighting source.

A typical LED device uses an LED chip as an initial light source to produce a first color light. The first color light emitted from the LED chip strikes a fluorescent substance dispersed within the LED device to generate a second color light. The second color light mixes with the first color light to form a resultant light having a desired color, such as a white light. However, the LED device emits light with only one color temperature, so when the color temperature is needed to change, the LED device also needs to be replaced, which is costly.

Therefore, what is needed is an LED device which can overcome the described limitations.

BRIEF DESCRIPTION OF THE DRAWINGS

Many aspects of the disclosure can be better understood with reference to the following drawing. The components in the drawing are not necessarily drawn to scale, the emphasis instead being placed upon clearly illustrating the principles of the present light emitting diode package for microminiaturization. Moreover, in the drawing, like reference numerals designate corresponding parts throughout the whole view.

DETAILED DESCRIPTION OF EMBODIMENTS

Figure 1:
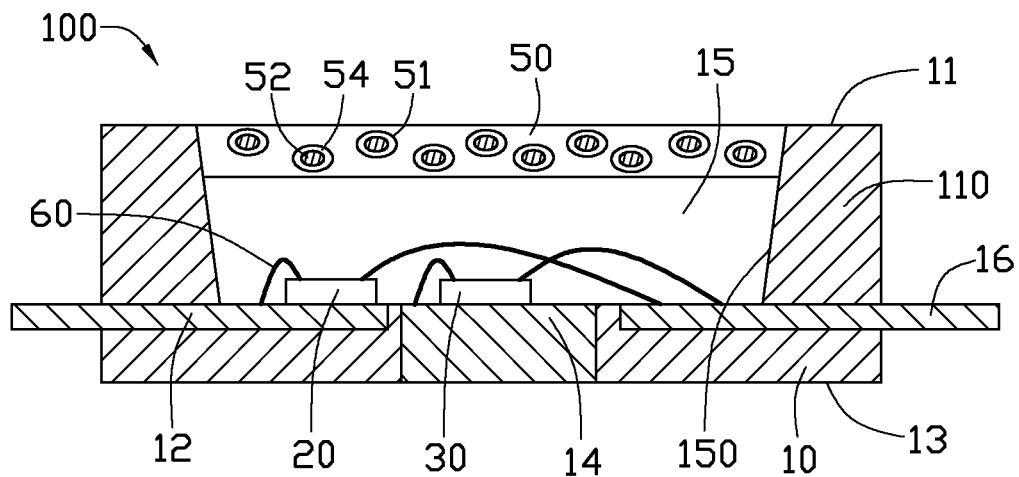
FIG. 1 is a cross-sectional view of an LED device in accordance with an embodiment of the present disclosure.

Referring to FIG. 1, a light emitting diode (LED) device 100 in accordance with an exemplary embodiment of the present disclosure is illustrated. The LED device 100 includes a substrate 10, a first LED chip 20 and a second LED chip 30 arranged on the substrate 10, and a phosphor layer 50 arranged above the first and second LED chips 20, 30.

The substrate 10 forms a cup 110 surrounding the first and second chips 20, 30 and includes a top surface 11 and a bottom surface 13 opposite to the top surface 11. The cup 110 of the substrate 10 defines a cavity 15 in a central portion thereof, which is recessed from the top surface 11, for receiving the first and second LED chips 20, 30 and the phosphor layer 50 therein. An inner side surface 150 of the cup 110 defining the cavity 15 is inclined, and a diameter of the cavity 15 gradually decreases along a direction from the top surface 11 toward the bottom surface 13. In one embodiment, a reflective layer can be coated on the inner side surface 150 of the cup 110 defining the cavity 15 for reflecting light of the first and second LED chips 20, 30 upwards.

A first electrical portion 12, a second electrical portion 14 and a third electrical portion 16 are arranged at a bottom of the cavity 15 in sequence for left to right of FIG. 1. The first and the third electrical portion 12, 16 are spaced and insulated from each other, and extend horizontally along opposite directions from the bottom of the cavity 15 to a position beyond the substrate 10, for connecting with peripheral power supply (not shown). The second electrical portion 14 is arranged between the first and third electrical portions 12, 16, and perpendicularly extends through the bottom surface 13 of the substrate 10. The second electrical portion 14 is spaced and insulated from the first and third electrical portions 12, 16.

In the present embodiment, the first LED chip 20 is arranged on the first electrical portion 12. Two electrodes of the first LED chip 20 are electrically connected to the first and third electrical portions 12, 16 via two conductive wires 60, respectively. The second LED chip 30 is arranged on the second electrical portion 14. Two electrodes of the second LED chip 30 are electrically connected to the second and third electrical portions 14, 16, respectively, also via two conductive wires 60. In the present embodiment, the first LED chip 20 is an ultraviolet (UV) LED chip, and the second LED chip 20 is a blue LED chip. The first LED chip 20 and the second LED chip 30 are controlled by independent power supply circuits. In an alternative embodiment, the second LED chip 30 can be arranged on the third electrical portion 16; in a further alternative embodiment, the first and second LED chips 20, 30 each can be formed as a flip chip. In a still further alternative embodiment, an encapsulant can be applied on the first and second LED chips 20, 30, for protecting the first and second LED chips 20, 30.

Figure 2:
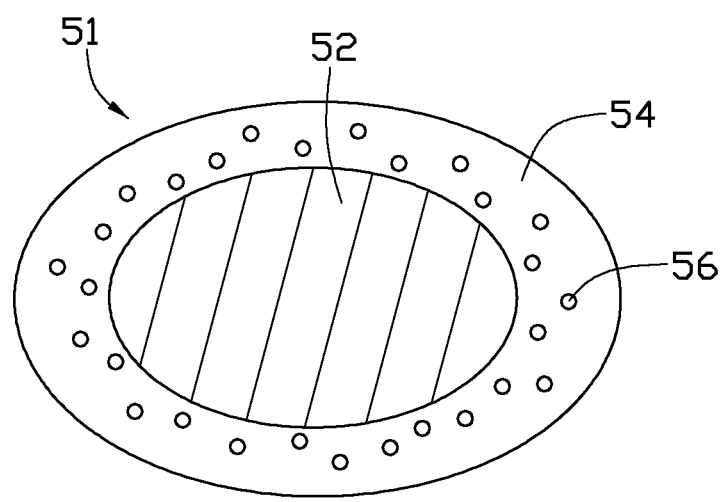
FIG. 2 is a cross-sectional view of a phosphor unit of the LED device of FIG. 1.

The phosphor layer 50 is arranged over the cavity 15 and seals a top of the cavity 15, and a top surface of the phosphor layer 50 is substantially coplanar with the top surface 11 of the substrate 10. Light emitted from the first and second LED chips 20, 30 travels through the phosphor layer 50 to an outside of the LED device 100 for lighting. The phosphor layer 50 is made of transparent materials such as resin, and a plurality of phosphor units 51 are doped into the transparent materials. The phosphor units 51 are evenly distributed in the phosphor layer 50. Referring to FIG. 2, each phosphor unit 51 includes a phosphor particle 52 and a silver halide layer 54 encapsulating the phosphor particle 52. In the present embodiment, the silver halide layer 54 is doped with copper oxide. The phosphor particles 52 are yellow phosphor substances, and can be selected from Yttrium Aluminum Garnet (YAG), terbium doped YGA, silicates, or combination thereof. In other embodiment, the entire cavity 15 can be filled with the phosphor layer 50.

During the use of the LED device 100, when the first LED chip 20 is turned off and the second LED chip 30 is turned on, blue light is generated. A part of the blue light emitted from the second LED chip 30 strikes the phosphor layer 50 to generate a secondary yellow light. The combination of the secondary yellow light and residual blue light produces a white light with a first color temperature. When the first LED chip 20 and the second LED chip 30 are both turned on, the first LED chip 20 emits UV light, oxidation-reduction reaction is occurred to the silver halide layer 54 by an action of the UV light, and the silver halide layer 54 is reduced by the UV light to produce silver particles 56 around the phosphor particles 52. The silver particles 56 are opaque and prevent light emitted from the first LED chip 20 from striking the phosphor particle 52; therefore, the struck area of each phosphor particle 52 is decreased. In other words, the part of blue light emitted from the second LED chip 30 striking the phosphor particles 52 is decreased, and the residual blue light is increased. Thus, the combination of the yellow secondary color light and residual blue light produces a white light with a second color temperature different from the first color temperature. In the present embodiment, the second color temperature is larger than the first color temperature. When the first LED chip 20 is turned off again, the silver particles 56 are catalyzed by the copper oxide and combined with halogen particles to form silver halide layer 54; therefore, the LED device 100 emits the white light with the first color temperature again.

In the present embodiment, the second color temperature of the LED device 100 can be changed by adjusting the current of the first LED chip 20. When the first LED chip 20 and the second LED chip 30 are both turned on, oxidation-reduction reaction is occurred to the silver halide layer 54 by an action of the UV light generated by the first LED chip 20, and the silver halide layer 54 is reduced by the UV light to produce silver particles 56 around the phosphor particles 54. If the current of the first LED chip 20 is decreased, the degree of the oxidation-reduction reaction is decreased, and the silver particles 56 produced by the silver halide layer 54 are decreased; therefore, the struck area of each phosphor particle 52 by the light emitted from the second LED chip 30 is increased; thus, the second color temperature of light emitted from the LED device 100 is decreased. On the other hand, if the current of the first LED chip 20 is increased, the degree of the oxidation-reduction reaction is increased, and the silver particles 56 produced by the silver halide layer 54 are increased; therefore, the struck area of each phosphor particle 52 by the light from the second LED chip 30 is decreased; thus, the second color temperature of light emitted from the LED device 100 is increased.

It is to be further understood that even though numerous characteristics and advantages have been set forth in the foregoing description of embodiments, together with details of the structures and functions of the embodiments, the disclosure is illustrative only; and that changes may be made in detail, especially in matters of shape, size, and arrangement of parts within the principles of the disclosure to the full extent indicated by the broad general meaning of the terms in which the appended claims are expressed.

What is claimed is:

1. A light emitting diode (LED) device, comprising:
   a substrate;
   a first LED chip and a second LED chip arranged on the substrate, the first LED chip being ultraviolet (UV) LED for generating UV light; and
   a phosphor layer arranged over the first and second LED chips, the phosphor layer comprising a plurality of phosphor units, each phosphor unit comprising a phosphor particle and a silver halide layer encapsulating the phosphor particle;
   wherein when the first LED chip is turned off and the second LED chip is turned on, a part of light emitted from the second LED chip travelling through the silver halide layer and striking the phosphor particles to generate a first light, which is combined with a residual part of the light emitted from the second LED chip to generated a first resultant light with a first color temperature; and
   wherein when the first LED chip and the second LED chip are both turned on, the silver halide layer being reduced by the UV light generated from the first LED chip to produce silver particles around the phosphor particles, a part of the light emitted from the second LED chip striking the phosphor particles to generate a second light, which is combined with a residual part of the light emitting from the second LED chip to generate a second resultant light with a second color temperature different from the first color temperature, the silver particles blocking the light emitted from the second LED chip from striking the phosphor particles.

2. The LED device of claim 1, wherein the second color temperature of the second resultant light generated by the LED device is changeable by adjusting a current supplied to the first LED chip.

3. The LED device of claim 2, wherein when the current supplied to the first LED chip is decreased, the silver particles produced by the silver halide layer are decreased, and the struck area of each phosphor particle by the part of the light emitted from the first LED chip is increased and the second color temperature of the second resultant light is decreased.

4. The LED device of claim 2, wherein when the current supplied the first LED chip is increased, the silver particles produced by the silver halide are increased, and the struck area of each phosphor particle by the part of the light emitted from the first LED chip is decreased and the second color temperature of the second resultant light is increased.

5. The LED device of claim 1, wherein the first LED chip and the second LED chip are powered by independent power supply circuits.

6. The LED device of claim 1, wherein the phosphor layer is made of resin, and the plurality of phosphor units are evenly distributed in the resin.

7. The LED device of claim 1, wherein the second LED chip is blue LED, and the phosphor particles are yellow phosphor particles.

8. The LED device of claim 1, wherein the substrate comprises a cup, a top surface and a bottom surface opposite to the top surface, the substrate defining a cavity in a central portion of cup for receiving the first and second LED chips in a bottom of the cavity, and the phosphor layer sealing a top of the cavity.

9. The LED device of claim 8, wherein a first electrical portion, a second electrical portion and a third electrical portion are arrange at the bottom of the cavity in sequence and insulated from each other, two electrodes of the first LED chip being electrically connected to the first and third electrical portions, respectively, two electrodes of the second LED chip being electrically connected to the second and third electrical portions, respectively.

10. The LED device of claim 1, wherein the second color temperature is higher than the first color temperature.

11. A light emitting diode (LED) device, comprising:
    a substrate having a cup defining a cavity therein;
    an ultraviolet (UV) LED chip and a blue LED chip received in the cavity, the UV LED chip and the blue LED chip being independently powered; and
    a phosphor layer sealing the UV and blue LED chips in the cavity, the phosphor layer comprising a plurality of phosphor units, each phosphor unit comprising a phosphor particle and a silver halide layer encapsulating the phosphor particle, UV light emitted from the UV LED being used to reduce the silver halide layer to produced silver particles around the phosphor particles;
    wherein the color temperature of light emitted from the LED device is capable of being adjusted by turning on or turning off the UV LED.

12. The LED device of claim 11, wherein when the UV LED is turn off and the blue LED chip is turned on, light emitted from the blue LED travelling through the phosphor layer and striking the phosphor particles to generate a first light with a first color temperature.

13. The LED device of claim 12, wherein when the UV LED and the blue LED are both turned on, the silver halide layer is reduced by the UV light to produce silver particles around the phosphor particles, and light emitted from the blue LED chip strikes the phosphor particles to generate a second light with a second color temperature higher than the first color temperature.

14. The LED device of claim 13, wherein the second color temperature of the second light generated by the LED device is changed by adjusting a current supplied to the UV LED chip.

15. The LED device of claim 14, wherein when the current supplied to the UV LED chip is decreased, the silver particles produced by the silver halide layer are decreased, so the struck area of each phosphor particle by the light emitted from by blue LED is increased and the second color temperature of the second light generated by the LED device is decreased.

16. The LED device of claim 14, wherein when the current supplied to the UV LED chip is increased, the silver particles produced by the silver halide are increased, so that the struck area of each phosphor particle by the light from the blue LED is decreased and the second color temperature of the second light generated by the LED device is increased.

17. The LED device of claim 11, wherein the phosphor particles are yellow phosphor particles.

* * * * *